United States Patent
Oomori (10) Patent No.: US 10,958,215 B2
(45) Date of Patent: Mar. 23, 2021

(54) SEMICONDUCTOR DEVICE AND SEMICONDUCTOR SYSTEM

(71) Applicant: LAPIS SEMICONDUCTOR CO., LTD., Kanagawa (JP)

(72) Inventor: Tetsuo Oomori, Kanagawa (JP)

(73) Assignee: LAPIS SEMICONDUCTOR CO., LTD., Yokohama (JP)

( * ) Notice: Subject to any disclaimer, the term of this patent is extended or adjusted under 35 U.S.C. 154(b) by 0 days.

(21) Appl. No.: 16/367,441

(22) Filed: Mar. 28, 2019

(65) Prior Publication Data

US 2019/0305727 A1 Oct. 3, 2019

(30) Foreign Application Priority Data

Mar. 30, 2018 (JP) .............................. JP2018-068472

(51) Int. Cl.
*H03B 5/36* (2006.01)
*H03B 5/32* (2006.01)
*H03B 5/00* (2006.01)
*H03L 5/00* (2006.01)
*G01C 19/5712* (2012.01)

(52) U.S. Cl.
CPC ................. *H03B 5/36* (2013.01); *H03B 5/00* (2013.01); *H03B 5/32* (2013.01); *H03B 5/364* (2013.01); *H03B 5/366* (2013.01); *H03L 5/00* (2013.01); *G01C 19/5712* (2013.01); *H03B 2200/005* (2013.01); *H03B 2200/0082* (2013.01); *H03B 2200/0094* (2013.01)

(58) Field of Classification Search
CPC . H03B 5/36; H03B 5/364; H03B 5/32; H03B 5/00; H03B 5/366; H03B 2200/005; H03B 2200/0082; H03B 2200/0094; G01C 19/5712; H03L 5/00

USPC ........................ 331/158, 116 FE, 177 V, 36 C
See application file for complete search history.

(56) References Cited

U.S. PATENT DOCUMENTS

| | | | | |
|---|---|---|---|---|
| 6,559,730 B1 * | 5/2003 | Marvin | .................. | H03B 5/366 331/116 FE |
| 7,639,097 B2 * | 12/2009 | Tran | ......................... | H03B 5/06 331/109 |
| 2014/0035689 A1 * | 2/2014 | Ozawa | .................. | H03B 5/366 331/158 |

FOREIGN PATENT DOCUMENTS

| | | | | |
|---|---|---|---|---|
| JP | 2005094147 | * | 4/2005 | ............... H03B 5/36 |
| JP | 2008147815 A | | 6/2008 | |

* cited by examiner

*Primary Examiner* — Arnold M Kinkead
(74) *Attorney, Agent, or Firm* — Volentine, Whitt & Francos, PLLC (57) ABSTRACT

A semiconductor device includes a resistor element connected to one and another end of a crystal oscillator, and an adjustable current type inverter element having an input connected to one end of the resistor element and an output connected to another end of the resistor element. A first capacitor element is connected to the input of the inverter element and to ground, and a second capacitor element has one end connected to ground. A first switching element switches a connection state of the one end of the first capacitor element and another end of the second capacitor element. A third capacitor element is connected to the output of the inverter element and to ground, and a fourth capacitor element has one end connected to ground. A second switching element switches a connection state of the one end of the third capacitor element and another end of the fourth capacitor element.

5 Claims, 9 Drawing Sheets

OSCILLATION FREQUENCY OF CRYSTAL OSCILLATOR

FIG.14

SEMICONDUCTOR DEVICE AND SEMICONDUCTOR SYSTEM

CROSS-REFERENCE TO RELATED APPLICATION

This application claims priority under 35 USC 119 from Japanese Patent Application No. 2018-068472, filed on Mar. 30, 2018, the disclosure of which is incorporated by reference herein.

BACKGROUND

Technical Field

The present disclosure relates to a semiconductor device and a semiconductor system.

Related Art

Oscillator circuits employing crystal oscillators (crystal oscillator circuits) are widely known semiconductor devices. With the recent trend toward lower consumed currents, lower consumed currents are also being demanded in crystal oscillator circuits. A strategy for achieving a lower consumed current is to match the crystal oscillator to enable the consumed current to be reduced to a current appropriate to a load capacity CL. There is generally a trade-off relationship in crystal oscillator circuits between consumed current and the time needed to start oscillation. Namely, reducing the consumed current means that the time needed to start oscillation becomes longer.

In methods using circuits to reduced consumed current, a known method generally adopted is to increase consumed current only at the start of oscillation of a crystal oscillator, and then to cut consumed current after the oscillation has stabilized. However, if current of the crystal oscillator is increased too much for the load capacity CL at the start of oscillation, stopping in the oscillation or abnormal oscillation may occur. Namely, since the current of the crystal oscillator at the start of oscillation can only be increased to a current appropriate for the load capacity CL, it can sometimes be difficult to bring the time needed to start oscillation down to the desired time or lower.

As another method for reducing consumed current, crystal oscillators having extremely small load capacities CL are employed to achieve ultra-low consumed current. However, due to the trade-off relationship described above, this method means that the oscillation start time is made even later, due to ultra-low consumed current. Namely, it is difficult to shorten the time to start oscillation without increasing the consumed current.

As technology to achieve both a shorter oscillation start time and a lower consumed current there is, for example, technology disclosed in Japanese Patent Application Laid-Open (JP-A) No. 2008-147815. The technology disclosed in JP-A No. 2008-147815 includes plural inverter elements driven for a fixed period from immediately after a crystal oscillator starts to oscillate until oscillation stabilizes, and only a single inverter element is then driven after the fixed period has elapsed.

In the technology disclosed in JP-A No. 2008-147815, since the consumed current is increased immediately after the crystal oscillator starts to oscillate to raise the driving capability, this may cause stop of oscillation or occurrence of abnormal oscillation. Moreover, in the technology disclosed in JP-A No. 2008-147815, a control circuit (controller) is needed to control driving in each of the plural inverter elements, which can result in greater consumed current overall. Moreover, the scale of circuits of the semiconductor device overall is large in the technology disclosed in JP-A No. 2008-147815.

SUMMARY

The present disclosure provides a semiconductor device and a semiconductor system that may shorten the oscillation start time of a crystal oscillator and may reduce the power consumption with a simple configuration.

A first aspect of the present disclosure is a semiconductor device including: a crystal oscillator; a resistor element connected between one end of the crystal oscillator and another end of the crystal oscillator; an adjustable current type inverter element having an input connected to one end of the resistor element and an output connected to another end of the resistor element; a first capacitor element having one end connected to the input of the inverter element and another end connected to ground; a second capacitor element having one end connected to ground; a first switching element that switches a connection state of the one end of the first capacitor element and another end of the second capacitor element; a third capacitor element having one end connected to the output of the inverter element and another end connected to ground; a fourth capacitor element having one end connected to ground; and a second switching element that switches a connection state of the one end of the third capacitor element and another end of the fourth capacitor element.

A second aspect of the present disclosure is a semiconductor system including: the semiconductor device of the first aspect; and a controller that outputs a control signal to control operation of the first switching element and the second switching element of the semiconductor device.

According to the above aspects, the present disclosure provides a semiconductor device and a semiconductor system that may shorten the oscillation start time of a crystal oscillator and may reduce the power consumption with a simple configuration.

BRIEF DESCRIPTION OF THE DRAWINGS

Exemplary embodiments will be described in detail based on the following figures, wherein.

DETAILED DESCRIPTION

First, explanation follows regarding principles of operation of crystal oscillator circuits in general, before moving on to explanation regarding a semiconductor device of an exemplary embodiment.

Figure 6:
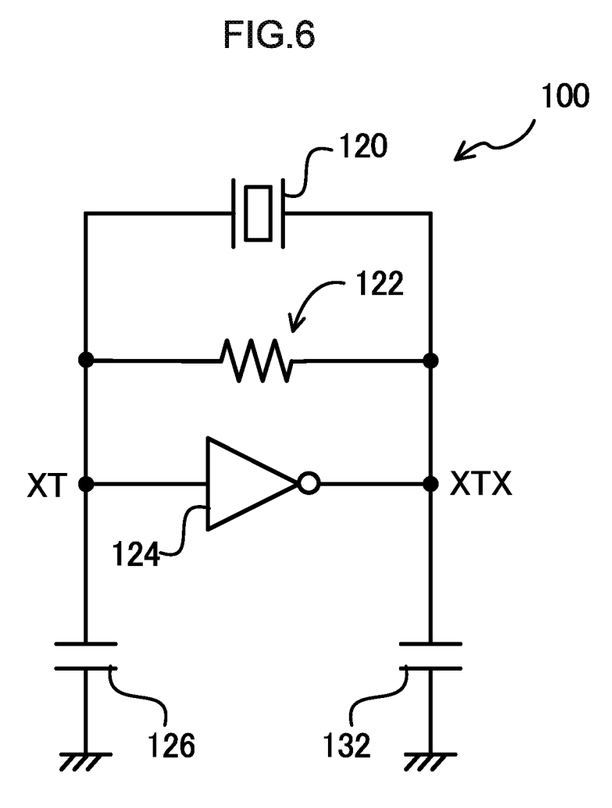
FIG. 6 is a circuit diagram of a generic crystal oscillator circuit.

FIG. 6 is a circuit diagram of a crystal oscillator circuit 100 serving as an example of a generic crystal oscillator circuit. The crystal oscillator circuit 100 illustrated in FIG. 6 includes a crystal oscillator 120, a feedback resistor element 122, an inverter element 124, and oscillating capacitor elements 126, 132.

Figure 7:
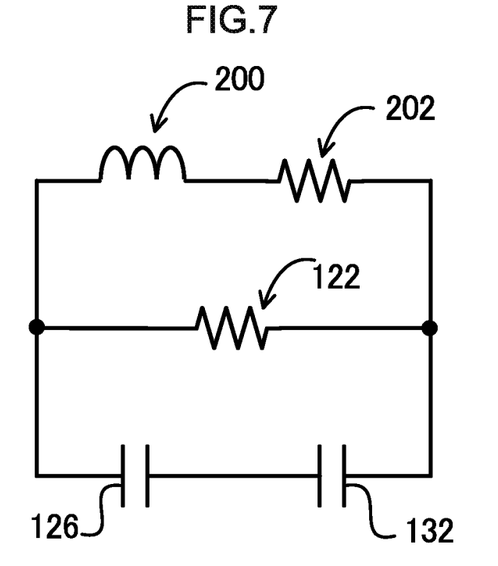
FIG. 7 is an equivalent circuit diagram for the crystal oscillator circuit illustrated in FIG. 6.

FIG. 7 illustrates an equivalent circuit diagram for the crystal oscillator circuit 100 illustrated in FIG. 6. In the equivalent circuit diagram illustrated in FIG. 7, the crystal oscillator 120 has been replaced with an inductance 200 and an effective resistance 202. Moreover, the respective sides of the circuit configured by the inverter element 124, the feedback resistor element 122, the oscillating capacitor elements 126, 132, have been replaced with the feedback resistor element 122 and the oscillating capacitor elements 126, 132.

Figure 8:
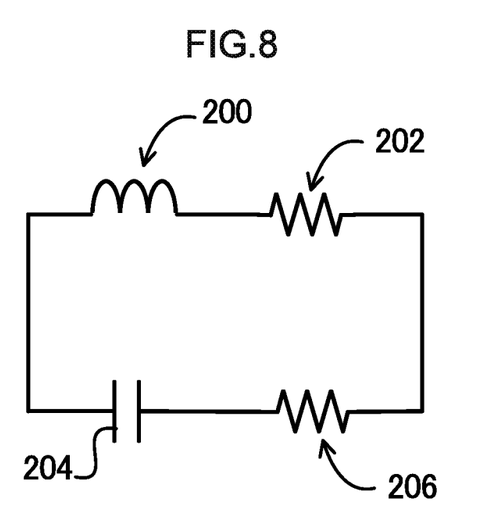
FIG. 8 is another equivalent circuit diagram for the crystal oscillator circuit illustrated in FIG. 7.

Note that in a case in which a resistance value Rf of the feedback resistor element 122 is sufficiently large, the circuit sides become equivalent to an equivalent circuit illustrated in FIG. 8, and may be expressed by a load capacitor 204 and a negative resistor 206.

The load capacity CL of the load capacitor 204 in the equivalent circuit illustrated in FIG. 8 can be expressed by Equation (1) below. A resistance value −RL of the negative resistor 206 can be expressed by Equation (2) below. Note that Cg denotes the capacity of the oscillating capacitor element 126, Cd denotes the capacity of the oscillating capacitor element 132, gm denotes the conductance of the inverter element 124, ΔIout denotes an amount of change in current in the inverter element 124, and ΔVin denotes an amount of change in input voltage to the inverter element 124.

$$CL = Cg \times Cd/(Cg+Cd) \quad (1)$$

$$-RL = -gm/(2\pi f)2 \times Cg \times Cd \quad (2)$$

$$gm = \Delta Iout/\Delta Vin \quad (3)$$

Here, in a case in which resistance value of the effective resistance 202 is denoted as Re, oscillation conditions of the crystal oscillator circuit expressed by the Equations (1) to (3) above can be expressed as below equation (4).

$$-RL \geq Re \quad (4)$$

In a case in which the condition of Equation (4) is satisfied, the effective resistance 202 of the crystal oscillator 120 is canceled out by the feedback resistor element 122, eliminating impedance loss of the crystal oscillator circuit 100, and enabling an LC oscillation circuit configured by the inductance 200 and the load capacitor 204 to oscillate.

Figure 9:
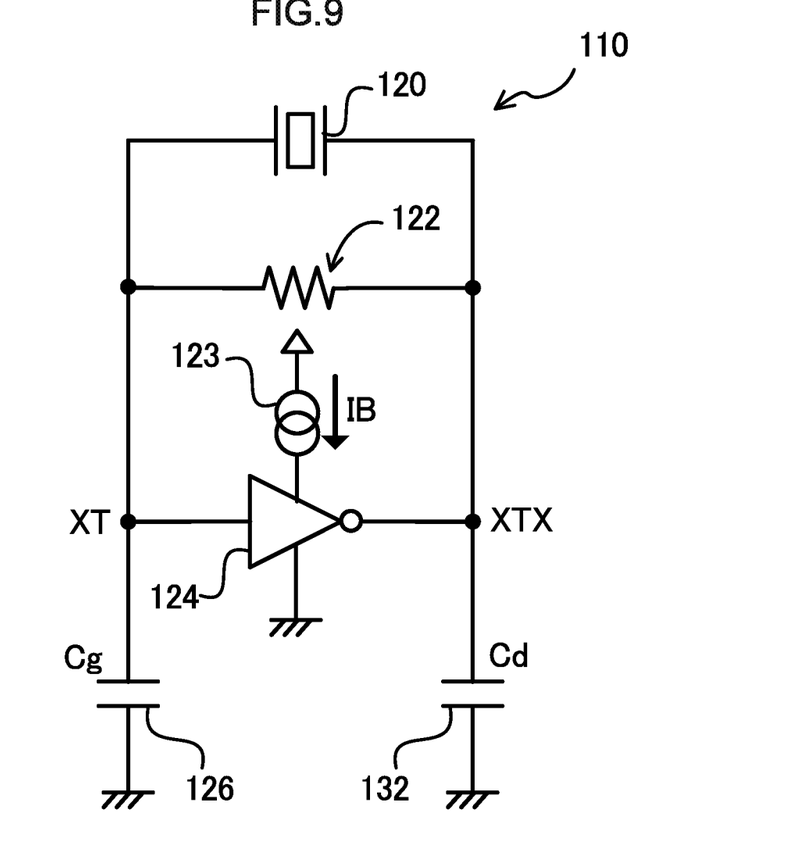
FIG. 9 is a circuit diagram of another example of a generic crystal oscillator circuit.

FIG. 9 is a circuit diagram illustrating a crystal oscillator circuit 110 as another example of a generic crystal oscillator circuit. The crystal oscillator circuit 110 illustrated in FIG. 9 differs from the crystal oscillator circuit 100 illustrated in FIG. 6 in which a current source 123 that generates a constant drive current to drive the inverter element 124 is provided.

In order to achieve lower consumed current, methods such as adjusting the size of an inverter element included in the crystal oscillator circuit or lowering the voltage of a drive power source, are known. However, it is difficult to reduce consumed current to the region of "a few μA" or "a few nA" using such methods. In the crystal oscillator circuit 110 illustrated in the example of FIG. 9, a constant drive current IB supplied by the current source 123 may reduce consumed current to the region of "a few μA" or "a few nA", by driving the inverter element 124.

Figures 10, 11:
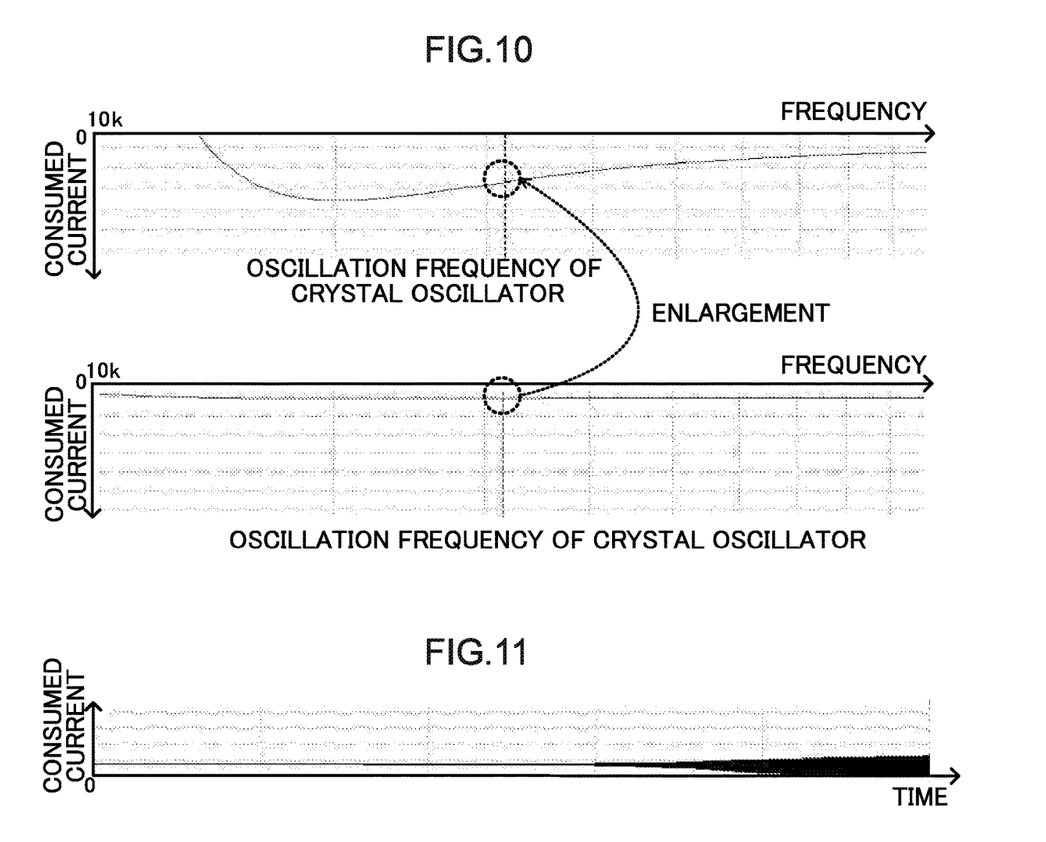
FIG. 10 is a graph illustrating negative resistance characteristics of the crystal oscillator circuit illustrated in FIG. 9.
FIG. 11 is a graph illustrating oscillation start characteristics of the crystal oscillator circuit illustrated in FIG. 9.

However, the time needed to start oscillation may be made longer due to this lowering in consumed current. FIG. 10 is a graph illustrating an example of negative resistance characteristics in the crystal oscillator circuit 110. FIG. 11 is a graph illustrating an example of oscillation start characteristics in the crystal oscillator circuit 110. It is clear from the negative resistance characteristics illustrated in FIG. 10 that there is little negative resistance in the crystal oscillator circuit 110. Moreover, it is also clear from the oscillation start characteristics illustrated in FIG. 11 that the oscillation start time is later in the crystal oscillator circuit 110 (time is needed until oscillation starts).

Figure 12:
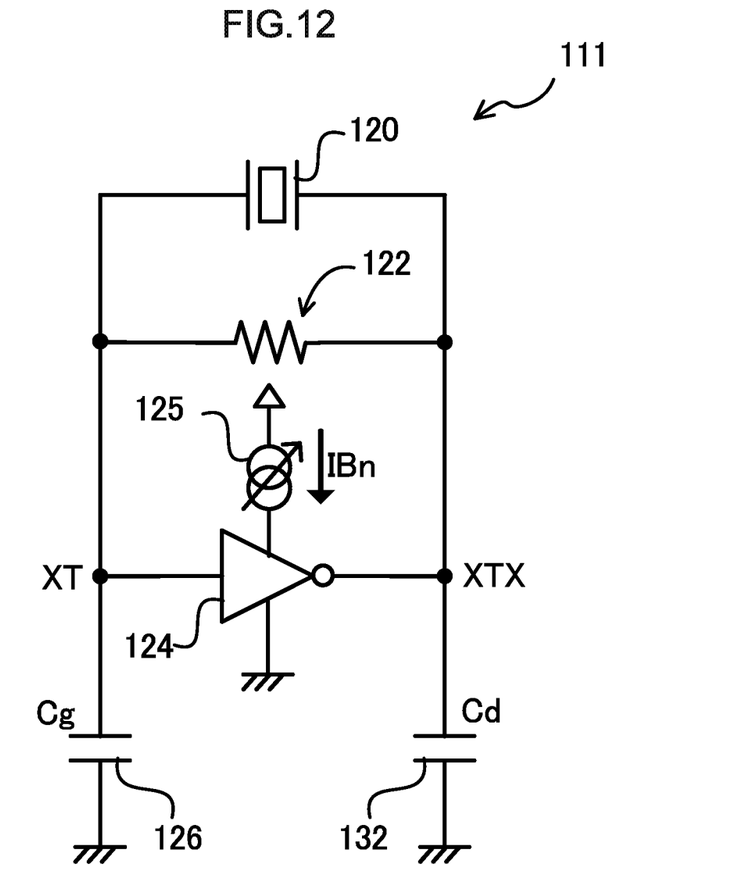
FIG. 12 is a circuit diagram of another example of a generic crystal oscillator circuit.

FIG. 12 is a circuit diagram illustrating a crystal oscillator circuit 111 as another example of a crystal oscillator circuit designed to achieve a lower consumed current. The crystal oscillator circuit 111 illustrated in FIG. 12 differs from the crystal oscillator circuit 110 illustrated in FIG. 9 in the provision of a current source 125 to supply a drive current IBn in which the amount of current is variable. Namely, the crystal oscillator circuit 111 illustrated in FIG. 12 includes an adjustable current type inverter element 124.

In the crystal oscillator circuit 111 illustrated in FIG. 12, increasing the current amount of the drive current IBn supplied by the current source 125 at the oscillation start time, resulting in earlier oscillation start-up. The current amount of the drive current IBn is then reduced after oscillation has stabilized. Operating the crystal oscillator circuit 111 in this manner improves the oscillation start time and achieves lower consumed current.

Equation (2) indicates that, in order to achieve even lower consumed current in the crystal oscillator circuit 111 illustrated in FIG. 12, a crystal oscillator should be employed in which the oscillating capacity Cg of the oscillating capacitor elements 126 and the oscillating capacity Cd of the oscillating capacitor element 132 are small. Namely, a crystal oscillator having a small constant for a load capacity CL needs to be employed. This enables the negative resistance −RL to satisfy the oscillation condition of Equation (4) above, even in cases in which the conductance gm of the inverter element 124 is reduced (namely, in a case in which the consumed current has been reduced). However, as described above, the oscillation start time becomes later as the consumed current is reduced.

As described above, in the crystal oscillator circuit 111, an improvement to the oscillation start time is possible by employing the crystal oscillator 120 having a small constant for the load capacity CL. Although increasing the drive current IBn of the inverter element 124 enables an earlier oscillation start-up, increasing the current of the inverter element 124 increases the conductance gm of the inverter element 124, as indicated by Equation (3) above. Accordingly, Equation (3) above indicates that as the value of the negative resistance −RL decreases, the frequency band also sometimes shifts more to the higher region than the oscillation frequency of the crystal oscillator 120.

Figure 13:
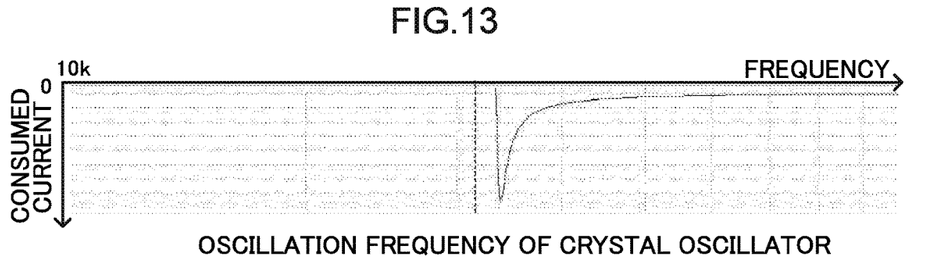
FIG. 13 is a graph illustrating negative resistance characteristics of the crystal oscillator circuit illustrated in FIG. 12.
Figure 14:
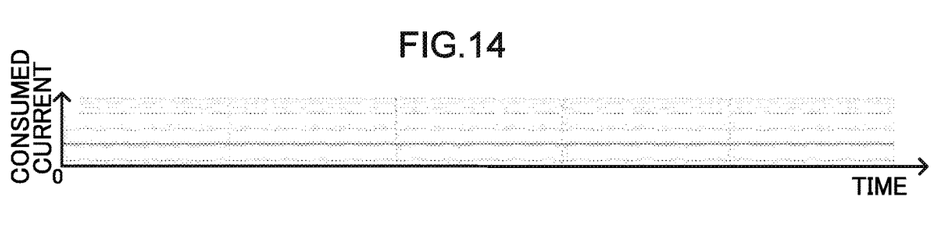
FIG. 14 is a graph illustrating oscillation start characteristics of the crystal oscillator circuit illustrated in FIG. 12.

FIG. 13 is a graph illustrating an example of negative resistance characteristics of the crystal oscillator circuit 111. FIG. 14 is a graph illustrating an example of oscillation start characteristics of the crystal oscillator circuit 111. It is clear from the negative resistance characteristics illustrated in FIG. 13 that negative resistance disappears (become a positive resistance) in the crystal oscillator circuit 111 and a shift occurs toward the higher region side of the oscillation frequency of the crystal oscillator 120. Moreover, it is clear from the oscillation start characteristics illustrated in FIG. 14 that oscillation is stopped in the crystal oscillator circuit 111.

Namely, it apparent that a current adjustment of more than a certain amount is not achievable by simply adjusting the drive current amount of the inverter element 124, even in a case in which the crystal oscillator 120 having a small constant for the load capacity CL is employed.

In a semiconductor device configured by a crystal oscillator circuit of the present exemplary embodiment, the oscillation start time of the crystal oscillator may be shortened and the power consumption may be reduced in comparison to the crystal oscillator circuits 100, 110, 111. Detailed explanation follows regarding the present exemplary embodiment, with reference to the drawings.

Figure 1:
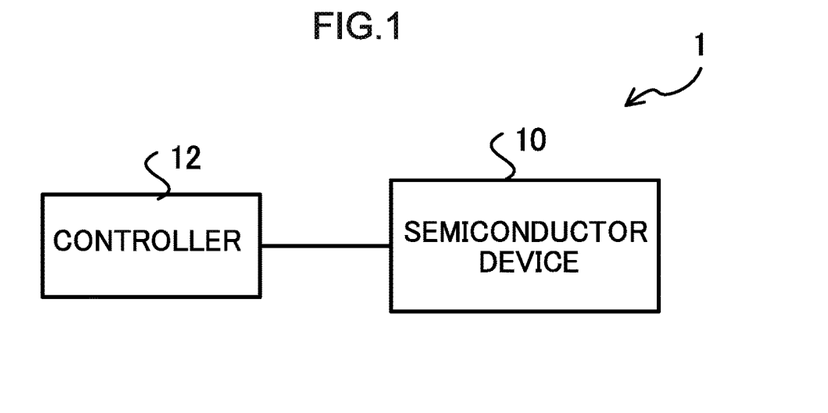
FIG. 1 is a configuration diagram illustrating configuration a semiconductor system of an exemplary embodiment.
Figure 2:
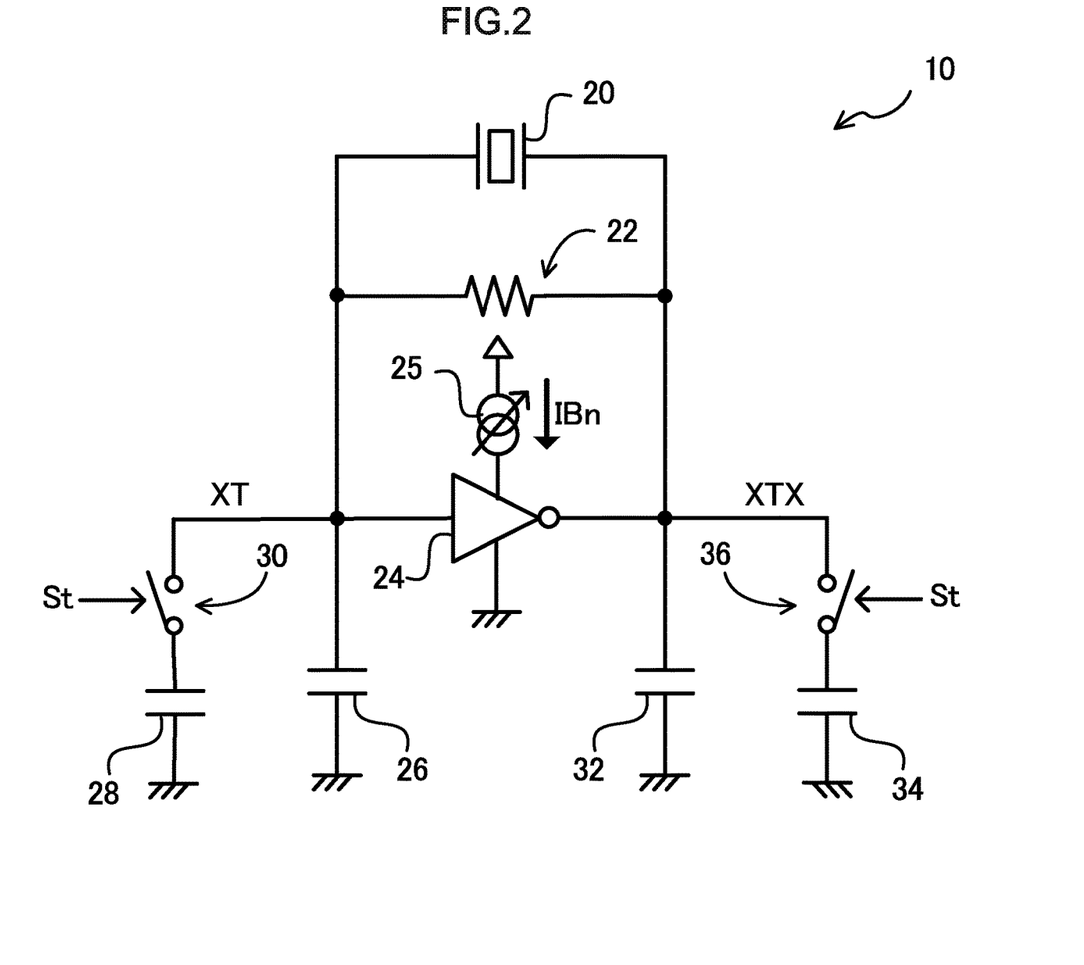
FIG. 2 is a circuit diagram illustrating a configuration of a semiconductor device of an exemplary embodiment.

FIG. 1 is a configuration diagram illustrating an example of a semiconductor system 1 provided with a semiconductor device 10 configured by a crystal oscillator circuit of the present exemplary embodiment. FIG. 2 is a circuit diagram illustrating an example of the semiconductor device 10 of the present exemplary embodiment.

As illustrated in FIG. 1, the semiconductor system 1 of the present exemplary embodiment includes the semiconductor device 10 configured by a crystal oscillator circuit, and a controller 12 to control the semiconductor device 10. The controller 12 of the present exemplary embodiment controls a drive current IBn of an inverter element 24 of the semiconductor device 10 and controls operation of switching elements 30, 36 (described in detail later) in a case in which starting oscillation in the semiconductor device 10 and in a case in which the oscillation state has stabilized. A Micro Control Unit (MCU) or a Central Processing Unit (CPU) may, for example, be employed as the controller 12 of the present exemplary embodiment, although there is no particular limitation thereto.

As illustrated in FIG. 2, the semiconductor device 10 of the present exemplary embodiment includes a crystal oscillator 20, a feedback resistor element 22, the inverter element 24, a current source 25, oscillating capacitors 26, 28, 32, 34, and the switching elements 30, 36.

The feedback resistor element 22 is connected between one end and the other end of the crystal oscillator 20. An input XT of the inverter element 24 is connected to one end of the feedback resistor element 22, and an output XTX is connected to the other end of the feedback resistor element 22. The current source 25 is a current source in which the amount of current is variable, and supplies a drive current IBn to the inverter element 24 at a current amount under control by the controller 12. In other words, the inverter element 24 of the present exemplary embodiment is an adjustable current type inverter element.

Namely, in the semiconductor device 10 of the present exemplary embodiment, the crystal oscillator 20, the feedback resistor element 22, and the inverter element 24 are connected together in parallel.

One end of the oscillating capacitor element 26 is connected to the input XT of the inverter element 24, and the other end of the oscillating capacitor element 26 is connected to ground (connected to a supply source GND potential). The oscillating capacitor element 26 of the present exemplary embodiment is an example of a first capacitor element of the present disclosure. The oscillating capacitor element 28 has one end connected to ground (connected to a supply source GND potential), and is a capacitor element with an oscillation capacity of Cgst. The oscillating capacitor element 28 of the present exemplary embodiment is an example of a second capacitor element of the present disclosure.

The switching element 30 switches connection state between one end of the oscillating capacitor element 26 and the other end of the oscillating capacitor element 28 in response to a control signal St output from the controller 12. The switching element 30 of the present exemplary embodiment is an example of a first switching element of the present disclosure.

One end of the oscillating capacitor element 32 is connected to the output XTX of the inverter element 24, and the other end of the oscillating capacitor element 32 is connected to ground (connected to a supply source GND potential). The oscillating capacitor element 32 of the present exemplary embodiment is an example of a third capacitor element of the present disclosure. The oscillating capacitor element 34 has one end connected to ground (connected to a supply source GND potential) and is an oscillating capacitor with an oscillation capacity of Cdst. The oscillating capacitor element 34 of the present exemplary embodiment is an example of a fourth capacitor element of the present disclosure.

The switching element 36 switches connection state between one end of the oscillating capacitor element 32 and the other end of the oscillating capacitor element 34 in response to a control signal St output from the controller 12. The switching element 36 of the present exemplary embodiment is an example of a second switching element of the present disclosure.

First, explanation follows regarding operation of the semiconductor device 10 of the present exemplary embodiment to achieve stable oscillation using the crystal oscillator 20 having a small constant for the load capacity CL even in a case in which the drive current IBn of the inverter element 24 is increased at oscillation start-up.

As described above, in a case in which the drive current IBn of the inverter element 24 is increased, sometimes the conductance gm of the inverter element 24 increases and oscillation stops. Note that if the load capacity CL is large, namely, if the oscillating capacity Cg of the oscillating capacitor element 26 and the oscillating capacity Cd of the oscillating capacitor element 32 are made large, then it follows from Equation (4) above that the oscillation start time can be shortened without decreasing the negative resistance, and without the frequency band shifting toward the higher region side of the oscillation frequency of the crystal oscillator 20.

In the semiconductor device 10 of the present exemplary embodiment, the current amount of the drive current IBn of the inverter element 24 can be increased by the current source 25. Moreover, in the semiconductor device 10, the switching element 30 is placed in an ON state to connect the oscillating capacitor element 28 and the input XT of the inverter element 24, and the switching element 36 is placed in an ON state to connect the oscillating capacitor element 34 and the output XTX of the inverter element 24. Accordingly, the oscillating capacity at the input XT side of the inverter element 24 becomes an oscillating capacity of Cg+Cgst in which the oscillating capacity Cg of the oscillating capacitor element 26 is added together with the oscillating capacity Cgst of the oscillating capacitor element 28. The oscillating capacity on the output XTX side of the inverter element 24, however, becomes an oscillating capacity of Cd+Cdst in which the oscillating capacity Cd of the oscillating capacitor element 32 is added together with the oscillating capacity Cdst of the oscillating capacitor element 34. Namely, the load capacity CL increases. Due to increasing the load capacity CL, the fall in negative resistance described above does not occur. Thus, the oscillation start time may be shortened without the frequency band shifting toward the higher region side of the oscillation frequency of the crystal oscillator 20.

Figure 3:
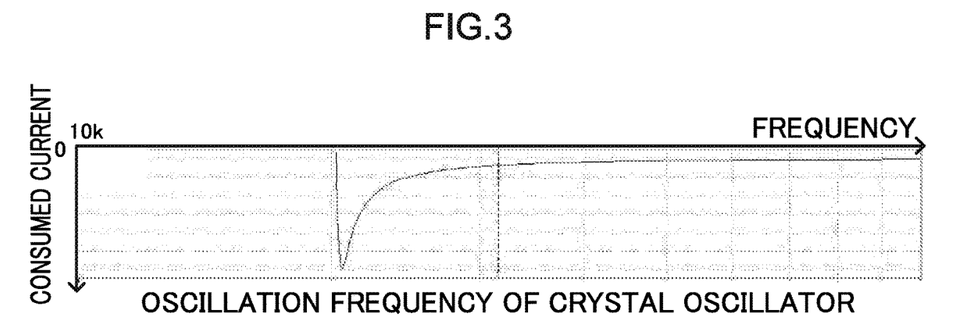
FIG. 3 is a graph illustrating negative resistance characteristics of a semiconductor device of an exemplary embodiment.
Figure 4:
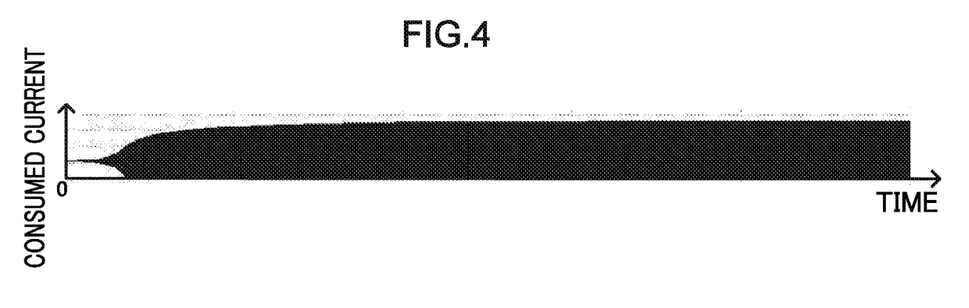
FIG. 4 is a graph illustrating oscillation start characteristics of a semiconductor device of an exemplary embodiment.

FIG. 3 is a graph illustrating an example of negative resistance characteristics in the semiconductor device 10. FIG. 4 is a graph illustrating an example of oscillation start characteristics in the semiconductor device 10. It is clear from the negative resistance characteristics illustrated in FIG. 3, that the negative resistance is maintained in the semiconductor device 10 of the present exemplary embodiment, and there is no shift toward the higher region side of the oscillation frequency of the crystal oscillator 20. Further, it is clear from the oscillation start characteristics illustrated in FIG. 4 that the time needed to start oscillation in the semiconductor device 10 of the present exemplary embodiment is shorter than in the crystal oscillator circuit 100 described above, or the like.

After oscillation has started in this manner and oscillation has furthermore stabilized, a lower consumed current can be achieved in the semiconductor device 10 of the present exemplary embodiment by reducing the drive current IBn of the inverter element 24, by placing the oscillating capacitor element 28 and the input XT of the inverter element 24 in a non-connected state using the switching element 30, and by placing the oscillating capacitor element 34 and the output XTX of the inverter element 24 in a non-connected state using the switching element 36.

Figure 5:
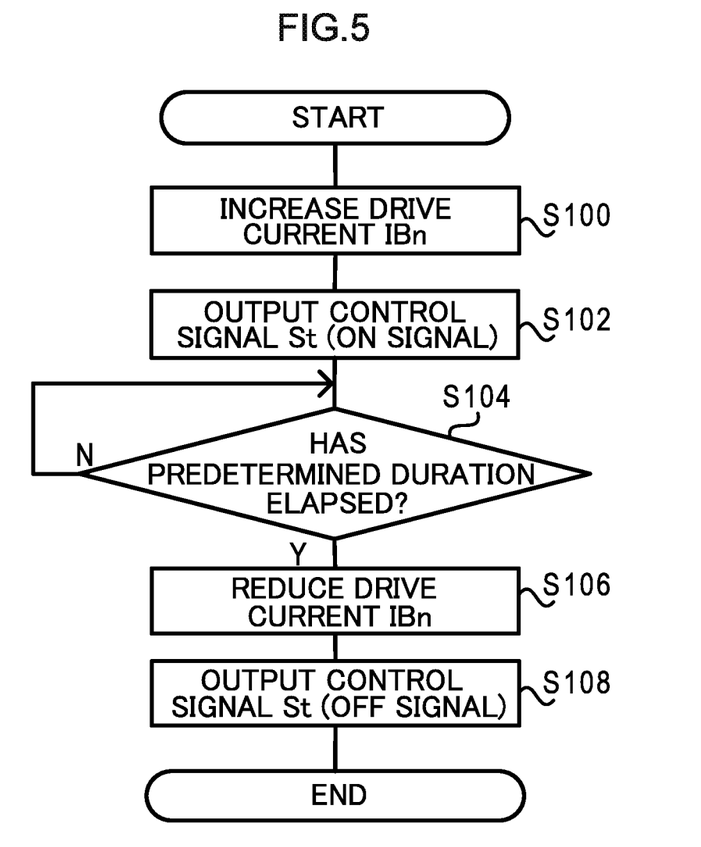
FIG. 5 is a flowchart illustrating an operation flow of a controller of a semiconductor system.

Explanation follows regarding operation of the controller 12 of the semiconductor system 1 of the present exemplary embodiment to operate the semiconductor device 10, with reference to a flowchart. The processing of the example flowchart illustrated in FIG. 5 is executed in a case in which the controller 12 receives an instruction to start oscillation of the semiconductor device 10.

At step S100, the controller 12 instructs the current source 25 of the semiconductor device 10 to increase the current amount of the drive current IBn as described above. In response to this instruction, the current amount is increased for the drive current IBn supplied from the current source 25 to the inverter element 24.

At the next step S102, the controller 12 outputs the control signal St to place the switching elements 30, 36 in an ON state. By placing the switching elements 30, 36 in an ON state in response to the control signal St, and the oscillating capacity on the input XT side of the inverter element 24 is increased to the oscillating capacity of Cg+Cgst as described above, and the oscillating capacity on the output XTX side of the inverter element 24 is increased thereby to the oscillating capacity of Cg+Cdst.

At the next step S104, the controller 12 determines whether or not a predetermined duration required for oscillation to stabilized has elapsed since the start of operation of the semiconductor device 10. Note that the predetermined duration may be obtained in advance through testing, simulation, or the like. The determination of step S104 is negative until the predetermined duration has elapsed. The determination of step S104 is affirmative in a case in which the predetermined duration has elapsed, and processing then proceeds to step S106.

At step S106, the controller 12 instructs the current source 25 of the semiconductor device 10 to reduce the current amount of the drive current IBn as described above. The current amount of the drive current IBn supplied from the current source 25 to the inverter element 24 is reduced in response to this instruction.

At the next step S108, the controller 12 outputs the control signal St to place the switching elements 30, 36 in an OFF state, and then ends the present operation. Due to the switching elements 30, 36 being placed in the OFF state in response to the control signal St, the oscillating capacity on the input XT side of the inverter element 24 is reduced to the oscillating capacity Cg as described above, and the oscillating capacity on the output XTX side of the inverter element 24 is reduced thereby to the oscillating capacity Cd.

Note that although explanation has been given regarding an embodiment in which the controller 12 adjusts the current amount of the drive current IBn supplied from the current source 25 and controls the states of connection of the switching elements 30, 36, there is no limitation to such an embodiment. One or both out of control to adjust the current amount and control of the states of connection may be performed by an element other than the controller 12. The control may, for example, be performed within the semiconductor device 10. Moreover, in order to start oscillation of the semiconductor device 10 and to change the current amount of the drive current IBn in response to stabilization of the oscillation as described above, changes in the current amount may be monitored, and control may then be performed so as to switch the states of connection of the switching elements 30, 36 in response to such changes.

Moreover, the timings of the operation of step S100 and the operation of step S102 are not limited to those of the present exemplary embodiment, and, for example, the operation of step S100 and the operation of step S102 may be performed at the same timing. Specifically, the controller 12 may output the control signal St to place the switching elements 30, 36 in the ON state while increasing the current amount of the drive current IBn. Moreover, the timing of the operation of step S106 and the timing of the operation of step S108 are not limited to those of the present exemplary embodiment, and, for example, the operation of step S106 and the operation of step S108 may be performed at the same timing. Specifically, the controller 12 may output the control signal St to place the switching elements 30, 36 in the ON state while reducing the current amount of the drive current IBn.

As described above, the semiconductor device 10 of the present exemplary embodiment includes: the crystal oscillator 20; the feedback resistor element 22 that is connected between one end of the crystal oscillator 20 and another end of the crystal oscillator 20; the adjustable current type inverter element 24 that has the input XT and the output XTX, with the input XT being connected to one end of the feedback resistor element 22 and the output XTX being connected to another end of the feedback resistor element 22; the oscillating capacitor element 26 that has one end connected to the input XT of the inverter element 24 and that has another end connected to ground; the oscillating capacitor element 28 that has one end connected to ground; the switching element 30 that switches connection state between the one end of the oscillating capacitor element 26 and another end of the oscillating capacitor element 28; the oscillating capacitor element 32 that has one end connected to the output XTX of the inverter element 24 and that has another end connected to ground; the oscillating capacitor element 34 that has one end connected to ground; and the switching element 36 that switches connection state between the one end of the oscillating capacitor element 32 and another end of the oscillating capacitor element 34.

Due to adopting the above configuration, the semiconductor device 10 of the present exemplary embodiment may achieve stable and early oscillation without oscillation stopping, even with a small load capacity CL at the start of oscillation. Moreover, lower consumed current may also be achieved after the oscillation has stabilized. Accordingly, the semiconductor device 10 of the present exemplary embodiment may shorten the oscillation start time of the crystal oscillator 20 and may reduce power consumption with a simple configuration.

Accordingly, the semiconductor device 10 of the present exemplary embodiment may reduce consumed current and may improve (faster) oscillation start time without depending on the load capacity CL.

Note that, in the present exemplary embodiment, a case in which the semiconductor device 10 is provided with the switching elements 30, 36 and the oscillating capacitors 28, 34, has been described. However, the present disclosure is not limited thereto. Some or all out of the switching elements 30, 36 and the oscillating capacitors 28, 34 may be configured by externally mounted elements. In cases in which these elements are externally mounted, an operation similar to that of the semiconductor device 10 may be performed both for a discrete crystal oscillator circuit 111, as illustrated in FIG. 12, or for a modular crystal oscillator 20.

Note that the configurations, operation, and the like of the semiconductor system 1 and the semiconductor device 10 described in the above exemplary embodiment are merely examples thereof, and obviously modifications may be made thereto according to circumstances within a range not departing from the spirit of the present disclosure.

What is claimed is:

1. A semiconductor device comprising:
a crystal oscillator;
a resistor element connected between one end of the crystal oscillator and another end of the crystal oscillator;
an adjustable current type inverter element having an input connected to one end of the resistor element and having an output connected to another end of the resistor element;
a first capacitor element having one end connected to the input of the adjustable current type inverter element and having another end connected to ground;
a second capacitor element having one end connected to ground;
a first switching element that switches a connection state between the one end of the first capacitor element and another end of the second capacitor element;
a third capacitor element having one end connected to the output of the adjustable current type inverter element and having another end connected to ground;
a fourth capacitor element having one end connected to ground; and
a second switching element that switches a connection state between the one end of the third capacitor element and another end of the fourth capacitor element,
wherein to start oscillation of the crystal oscillator the first switching element is configured to connect the one end of the first capacitor element to the another end of the second capacitor element, and the second switching element is configured to connect the one end of the third capacitor element to the another end of the fourth capacitor element,
wherein in response to a change in a drive current of the adjustable current type inverter element the first switching element is configured to switch the connection state of the one end of the first capacitor element and the another end of the second capacitor element, and the second switching element is configured to switch the connection state of the one end of the third capacitor element and the another end of the fourth capacitor element, and
wherein when the drive current of the adjustable current type inverter element becomes smaller than a predetermined current amount the first switching element is configured to disconnect the one end of the first capacitor element from the another end of the second capacitor element, and the second switching element is configured to disconnect the one end of the third capacitor element from the another end of the fourth capacitor element.

2. The semiconductor device of claim 1, wherein when the oscillation of the crystal oscillator has stabilized the first switching element is configured to disconnect the one end of the first capacitor element from the another end of the second capacitor element, and the second switching element is configured to disconnect the one end of the third capacitor element from the another end of the fourth capacitor element.

3. The semiconductor device of claim 1, wherein when a predetermined duration has elapsed since the oscillation of the crystal oscillator has started the first switching element is configured to disconnect the one end of the first capacitor element from the another end of the second capacitor element, and the second switching element is configured to disconnect the one end of the third capacitor element from the another end of the fourth capacitor element.

4. The semiconductor device of claim 1, wherein the first switching element and the second switching element operate in response to a control signal.

5. A semiconductor system comprising:
the semiconductor device of claim 1; and
a controller that outputs a control signal to control operation of the first switching element and the second switching element of the semiconductor device.

* * * * *